(12) United States Patent
Suehiro et al.

(10) Patent No.: US 7,781,794 B2
(45) Date of Patent: Aug. 24, 2010

(54) RESIN SHEET FOR ENCAPSULATING OPTICAL SEMICONDUCTOR ELEMENT AND OPTICAL SEMICONDUCTOR DEVICE

(75) Inventors: Ichiro Suehiro, Ibaraki (JP); Kouji Akazawa, Ibaraki (JP); Hideyuki Usui, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/409,782

(22) Filed: Mar. 24, 2009

(65) Prior Publication Data

US 2009/0242928 A1 Oct. 1, 2009

(30) Foreign Application Priority Data

Mar. 25, 2008 (JP) .............................. 2008-078352

(51) Int. Cl.
*H01L 33/00* (2010.01)
(52) U.S. Cl. ........................ 257/100; 257/790; 257/791; 257/E23.116
(58) Field of Classification Search .................. 257/100, 257/790, 791, 792, E23.116
See application file for complete search history.

(56) References Cited

U.S. PATENT DOCUMENTS

| 2002/0187570 | A1 | 12/2002 | Fukasawa et al. |
| 2004/0145044 | A1 | 7/2004 | Sugaya et al. |
| 2004/0160750 | A1 | 8/2004 | Masuko |
| 2006/0157722 | A1 | 7/2006 | Takezawa et al. |
| 2006/0261366 | A1* | 11/2006 | Yang ........................... 257/100 |
| 2007/0187708 | A1* | 8/2007 | Setomoto et al. .............. 257/99 |
| 2008/0251949 | A1* | 10/2008 | Sin et al. ..................... 257/787 |

FOREIGN PATENT DOCUMENTS

| EP | 0 684 648 A2 | 11/1995 |
| EP | 1 538 681 A2 | 6/2005 |
| JP | 2005-223216 A | 8/2005 |
| WO | 2007/139098 A1 | 12/2007 |

OTHER PUBLICATIONS

European Search Report dated Jul. 27, 2009.

\* cited by examiner

*Primary Examiner*—Trung Dang
(74) *Attorney, Agent, or Firm*—Sughrue Mion, PLLC

(57) ABSTRACT

The present invention provides a resin sheet for encapsulating an optical semiconductor element, the resin sheet containing an encapsulation resin layer, an adhesive resin layer, a metal layer and a protective resin layer, in which the encapsulation resin layer and the metal layer adhered onto the adhesive resin layer are disposed adjacently to each other, the protective resin layer is laminated on the encapsulation resin layer and the metal layer so as to cover both the encapsulation resin layer and the metal layer, and the encapsulation resin layer has a taper shape expanding toward the protective resin layer; and an optical semiconductor device containing an optical semiconductor element encapsulated by using the resin sheet. The optical semiconductor element encapsulation resin sheet of the invention can be suitably used for back lights of liquid crystal screens, traffic signals, large-sized outdoor displays, billboards and the like.

4 Claims, 2 Drawing Sheets

RESIN SHEET FOR ENCAPSULATING OPTICAL SEMICONDUCTOR ELEMENT AND OPTICAL SEMICONDUCTOR DEVICE

FIELD OF THE INVENTION

The present invention relates to a resin sheet for encapsulating optical semiconductor element and an optical semiconductor device obtained by using the same.

BACKGROUND OF THE INVENTION

In an optical semiconductor device, it has been studied to mount a plurality of light emitters on a surface of a substrate and to allow these light emitters to emit light, thereby using them as a planar light emitting source. In particular, it has been studied to use light-emitting diode bare chips (LED bare chips) as the light emitters. As such a light emitting source, there is, for example, one containing a substrate, a plurality of LED bare chips mounted on a surface of the substrate, a resin body for individually encapsulating these LED bare chips, a reflecting plate which has a reflecting hole opened corresponding to the resin body and a back side of which is adhered to the surface of the substrate, and a lens plate covering the whole of the substrate and having lenses in portions corresponding to the LED bare chips (see, JP-A-2005-223216). Accordingly, a step of encapsulating an optical semiconductor element and a step of mounting a metal layer as a reflecting plate on a substrate have hitherto been performed separately.

SUMMARY OF THE INVENTION

An object of the invention is to provide a resin sheet for encapsulating optical semiconductor element (which may be also referred to as "optical semiconductor encapsulation resin sheet" hereinafter), which is capable of simplifying a step of encapsulating an optical semiconductor element and a step of mounting a metal layer on a substrate to thereby efficiently perform encapsulation of an optical semiconductor element; and an optical semiconductor device containing an optical semiconductor element encapsulated by using the optical semiconductor element encapsulation resin sheet.

Namely, the present invention provides the following items 1 to 4.

1. A resin sheet for encapsulating an optical semiconductor element, the resin sheet comprising an encapsulation resin layer, an adhesive resin layer, a metal layer and a protective resin layer, wherein the encapsulation resin layer and the metal layer adhered onto the adhesive resin layer are disposed adjacently to each other, wherein the protective resin layer is laminated on the encapsulation resin layer and the metal layer so as to cover both the encapsulation resin layer and the metal layer, and wherein the encapsulation resin layer has a taper shape expanding toward the protective resin layer.

2. The resin sheet according to item 1, wherein an angle expanding toward the protective resin layer in the shape of the encapsulation resin layer is from 30 to 50 degrees.

3. The resin sheet according to item 1, wherein the metal layer comprises copper or aluminum.

4. An optical semiconductor device comprising an optical semiconductor element encapsulated by using the resin sheet according to item 1.

The optical semiconductor encapsulation resin sheet of the invention is capable of simplifying a step of encapsulating an optical semiconductor element and a step of mounting a metal layer on a substrate to thereby efficiently perform encapsulation of an optical semiconductor element. Furthermore, an optical semiconductor device containing an optical semiconductor element encapsulated by using the resin sheet can be efficiently produced.

BRIEF DESCRIPTION OF THE DRAWINGS

FIG. 2A shows a step of forming an adhesive resin layer on a substrate. FIG. 2B shows a step of forming a metal layer on the adhesive resin layer. FIG. 2C shows a step of forming a through-hole through the adhesive resin layer and the metal layer. FIG. 2D shows a step of filling an encapsulation resin in the through-hole to form an encapsulation resin layer. FIG. 2E shows a step of laminating a protective resin layer on the layer obtained in FIG. 2D.

DESCRIPTION OF REFERENCE NUMERALS AND SIGNS

1 Optical Semiconductor Element Encapsulation Resin Sheet
2 Protective Resin Layer
3 Encapsulation Resin Layer
4 Adhesive Resin Layer
5 Metal Layer
6 Optical Semiconductor Element Formed on Substrate
7 Base Material
8 Through-hole
9 Angle Expanding toward Protective Resin Layer

DETAILED DESCRIPTION OF THE INVENTION

The invention relates to an optical semiconductor element encapsulation resin sheet containing at least an encapsulation resin layer, an adhesive resin layer, a metal layer and a protective resin layer, in which the encapsulation resin layer and the metal layer adhered onto the adhesive resin layer are disposed adjacently to each other, the protective resin layer is laminated on the encapsulation resin layer and the metal layer so as to cover both the encapsulation resin layer and the metal layer, and the encapsulation resin layer has a taper shape expanding toward the protective resin layer.

Such an optical semiconductor element encapsulation resin sheet is a sheet in which the metal layer and the encapsulation resin layer are integrally combined to each other, so that the above-mentioned two steps of encapsulating an optical semiconductor element and of mounting a metal layer on a substrate can be simplified by one step of encapsulating an optical semiconductor element with the use of the sheet.

Figure 1A:
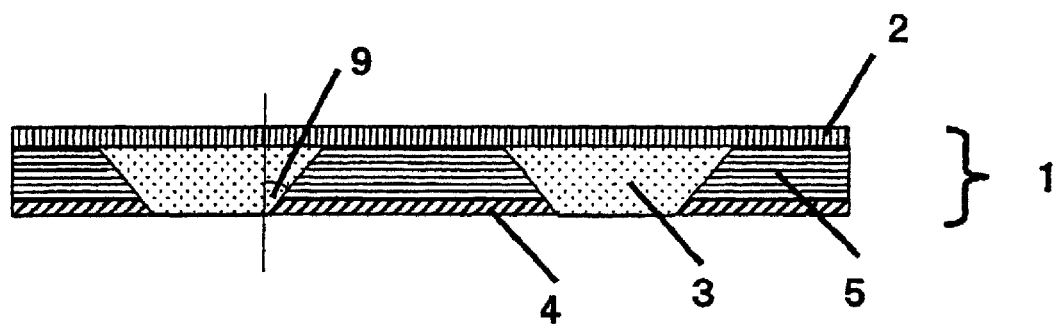
FIG. 1A is a schematic view showing one embodiment of the optical semiconductor element encapsulation resin sheet of the invention.

In the invention, the expression "the encapsulation resin layer and the metal layer adhered onto the adhesive resin layer are disposed adjacently to each other" means that the encapsulation resin layer and the metal layer adhered onto the adhesive resin layer are disposed adjacently to each other in such a way that the encapsulation resin layer can encapsulate an optical semiconductor element on a substrate, and at the same time, the adhesive resin layer adhered to the under side of the metal layer can be adhered to the substrate on which the optical semiconductor element is mounted. FIG. 1A is a schematic view showing one embodiment of the invention. An encapsulation resin layer 3 and a metal layer 5 adhered onto an adhesive resin layer 4 may be disposed adjacently to each other at one or more places. That is to say, the encapsulation resin layer and the metal layer adhered onto the adhesive resin layer may be disposed adjacently to each other continuously one after the other. Further, the encapsulation resin layers and the metal layers can be disposed adjacently to each other by appropriately adjusting the number, size and the like of the encapsulation resin layers and the metal layers corresponding to the number of the optical semiconductor elements and the disposition spacing thereof. Incidentally, in order to dispose the adhesive resin layer and the metal layer adjacently to each other, what is necessary is, for example, to form the metal layer on the adhesive resin layer, to form at least one taper-shaped through-hole passing through the both layers and to form the encapsulation resin layer therein.

In the invention, the expression "the protective resin layer is laminated on the encapsulation resin layer and the metal layer so as to cover both the encapsulation resin layer and the metal layer" means that the protective resin layer is laminated on the encapsulation resin layer and the metal layer so as to cover the both layers to protect the encapsulation resin layer and the metal layer from the external environment, as shown in FIG. 1A. In order to laminate the protective resin layer, for example, the protective resin layer is laminated on the both layers of the encapsulation resin layer and the metal layer by known methods (for example, laminating, pressing and the like), or after the protective resin layer is laminated on the metal layer having the through-hole, an encapsulation resin may be filled in the through-hole to form the encapsulation resin layer.

In the invention, the expression "the encapsulation resin layer has a taper shape expanding toward the protective resin layer" means that the encapsulation resin layer has a shape widened toward the protective resin layer. Namely, the encapsulation resin layer has such a shape that the cross-sectional area thereof in the direction which is perpendicular to the thickness direction thereof increases from the side on which the protective resin layer is not disposed towards the side on which the protective resin layer is disposed. The angle expanding toward the protective resin layer (for example, indicated by reference numeral 9 in FIG. 1A) in the shape of the encapsulation resin layer is preferably from 30 to 50 degrees and more preferably from 30 to 45 degrees.

The encapsulation resin layer in the invention is preferably a thermosetting resin in a semi-cured state, from the viewpoint of encapsulating the optical semiconductor element such as an LED. In particular, it is preferably formed of a silicone resin, a polyborosiloxane resin, a polyaluminosiloxane resin, an epoxy resin or the like, from the viewpoint of heat resistance. Further, a fluorescence agent for adjusting an emission color of the LED may be added to the encapsulation resin layer as needed.

The thickness of the encapsulation resin layer is preferably from 0.3 to 1 mm, and more preferably from 0.3 to 0.5 mm, from the viewpoints of the LED height, the wiring wire height and light absorption by the resin.

The encapsulation resin layer is taper-shaped and has the above-mentioned thickness. The shape thereof is not particularly limited so long as the effects of the invention are not impaired, and it is sufficient to be a shape which at least can encapsulate an optical semiconductor element. For example, the shape of a bottom face (a face on the base material side) of the encapsulation resin layer is circular, elliptical, quadrangular or the like, and is not particularly limited. Further, the size of the bottom face is, for example, preferably from 1.5 to 5 mm in diameter in the circular case, and 1.5 to 5 mm×1.5 to 5 mm in the quadrangular case. The encapsulation resin layer having such a bottom face shape is formed by making at least one through-hole which passes through the adhesive resin layer and the metal layer, has the above-mentioned bottom face shape and is expanded in an upwardly-widened tapered shape, for example, by punching, drilling or the like, filling the encapsulation resin therein, and then semi-curing the encapsulation resin.

The number of the encapsulation resin layers in the optical semiconductor element encapsulation resin sheet of the invention can be appropriately changed in accordance with the number of the optical semiconductor elements to be encapsulated, which are disposed on the substrate. However, it is preferably from 1 to 20, and more preferably from 1 to 9, based on the unit area ($cm^2$) of the sheet. The spacing therebetween can also be allowed to correspond to the optical semiconductor elements on the substrate, and the encapsulation resin layers may be equally spaced.

When the thermosetting resin in a semi-cured state is used for the encapsulation resin layer, the above-mentioned uncrosslinked thermosetting resin is heated, for example, at 80 to 120° C. for 5 to 30 minutes. Further, in the case of curing treatment after encapsulation of the optical semiconductor element, the encapsulation resin layer may be secondarily cured, for example, at 100 to 150° C. for 1 to 24 hours.

The adhesive resin layer in the invention is preferably a thermosetting resin in a semi-cured state, from the viewpoint of adhering it to the substrate. In particular, it is preferably formed of an epoxy resin or a polycarbodiimide resin, from the viewpoint of adhesiveness.

The above-mentioned adhesive resin layer can be obtained for example, by preparing a resin solution in which the above-mentioned resin commercially available is dissolved in an organic solvent such as toluene, cyclohexane or methyl ethyl ketone preferably to a concentration of 10 to 30% by weight, forming a film on the release-treated substrate to an appropriate thickness by methods such as casting, spin coating and roll coating, and further drying it at a temperature at which the solvent can be removed without progressing curing reaction. The temperature or time for drying the resin solution to be formed as the film varies depending on the kind of resin or solvent, and cannot be indiscriminately determined. However, the temperature is preferably from 80 to 150° C., and more preferably from 100 to 120° C. The time is preferably from 1 to 30 minutes, and more preferably from 3 to 10 minutes. The resin layers obtained as described above can be used alone or as a laminate of a plurality thereof.

The thickness of the adhesive resin layer is preferably from 5 to 50 μm, and more preferably from 10 to 20 μm, from the viewpoint of preventing stray light.

The metal layer in the invention is preferably formed of copper or aluminum having good thermal conductivity, in order to radiate heat generated in the optical semiconductor element. The formation of the metal layer becomes possible by laminating a foil of the above-mentioned metal, for example, on the adhesive resin layer at 100 to 180° C. and at 0.2 to 0.5 MPa. Further, in order to prevent deformation of the metal layer at the time of molding, annealing treatment of the metal may be performed. Annealing of aluminum can be performed, for example, by conducting heat treatment under a nitrogen atmosphere at 350° C. for 1 to 2 hours, followed by returning the temperature to ordinary temperature.

The thickness of the metal layer may be any, so long as it is sufficient for encapsulating the optical semiconductor element with the adjacent encapsulation resin layer, and is preferably from 0.5 to 1 mm.

The protective resin layer in the invention may be either a thermosetting resin or a thermoplastic resin. Examples of the thermosetting resins include an epoxy resin in a semi-cured state, and examples of the thermoplastic resins include resins having high transparency such as polymethyl methacrylate, polyethylene terephthalate (PET) and a polycarbonate. These may be formed into a sheet form to form the protective resin layer.

The thickness of the protective resin layer is preferably from 20 to 3,000 μm, and more preferably from 20 to 100 μm, from the viewpoint of optical loss caused by the resin.

The protective resin layer may be laminated with the interposition of one or more other layers (intermediate layers), as desired. Such intermediate layers include a layer having a refractive index lower than that of the encapsulation resin layer, a layer on which fine unevenness is formed, and the like.

The optical semiconductor element encapsulation resin sheet of the invention, as one embodiment thereof, preferably contains an encapsulation resin layer formed of a polyaluminosiloxane resin, a silicone resin, an epoxy resin or the like; an adhesive resin layer formed of an epoxy resin; a protective resin layer formed of an acrylic resin, an epoxy resin or the like; and a metal layer formed of aluminum.

The thickness of the optical semiconductor element encapsulation resin sheet of the invention is desirably from 0.4 to 1 mm, and more preferably from 0.4 to 0.6 mm, from the viewpoints of lightness in weight, miniaturization and after processability.

Figure 1B:
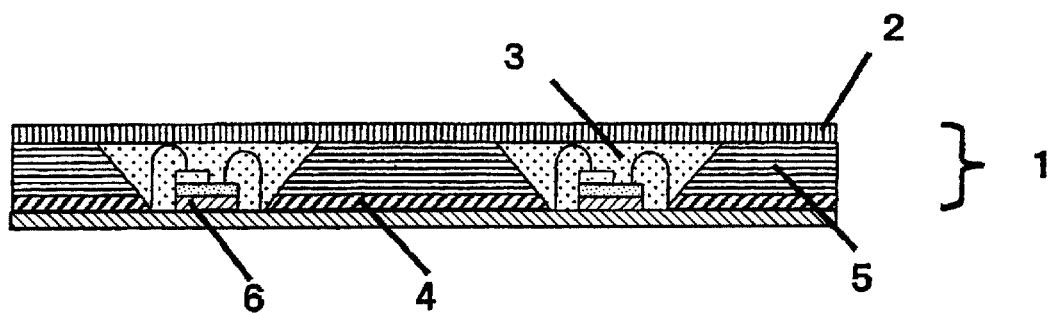
FIG. 1B is a schematic view showing one embodiment in which an optical semiconductor element mounted on a substrate is encapsulated by using the optical semiconductor element encapsulation resin sheet of the invention.

A schematic view of one embodiment of the optical semiconductor element encapsulation resin sheet 1 of the invention is shown in FIG. 1A. An encapsulation resin layer 3 and a metal layer 5 adhered onto an adhesive resin layer 4 are disposed adjacently to each other, and a protective resin layer 2 is laminated on both the encapsulation resin layer 3 and the metal layer 5. The encapsulation resin layer 3 has a taper shape expanding toward the protective resin layer at an angle 9. Further, one embodiment in which an optical semiconductor element 6 mounted on a substrate is encapsulated by using the optical semiconductor element encapsulation resin sheet 1 of the invention is shown in FIG. 1B.

In the invention, one embodiment of a production process of the optical semiconductor element encapsulation resin sheet 1 of the invention may include at least steps of:

a) forming an adhesive resin layer on a release-treated base material, b) forming a metal layer on the adhesive resin layer, c) forming a taper-shaped through-hole for forming an encapsulation resin layer through the adhesive resin layer and the metal layer adhered onto the adhesive resin layer, d) filling an encapsulation resin for forming the encapsulation resin layer in the through-hole formed, and semi-curing the encapsulation resin, and e) laminating a protective resin layer on the encapsulation resin layer and the metal layer so as to cover both the encapsulation resin layer and the metal layer.

According to such a production process, the optical semiconductor element encapsulation resin sheet which is capable of efficiently performing encapsulation can be produced. Further, schematic views illustrating one embodiment of such a production process are shown in FIGS. 2A to 2E.

A more specific embodiment will be exemplified. In the above-mentioned step a) or FIG. 2A, the release-treated base material 7 is preferably a PET film. For the formation of the adhesive resin layer 4, for example, 40 to 70 parts by weight of a transfer molding transparent epoxy resin is dissolved in a methyl ethyl ketone solvent at a base of 10 to 30% by weight to prepare a coating solution. Then, the coating solution is applied onto the release-treated base material 7 preferably to a thickness of 5 to 50 μm and more preferably to a thickness of 10 to 20 μm, followed by drying at 80 to 120° C. for 5 to 30 minutes. The layer thus obtained can be used alone or as a laminate of a plurality thereof, thereby forming the adhesive resin layer 4.

Figure 2A:
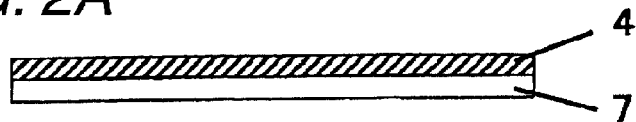
FIGS. 2A to 2E are schematic views illustrating one embodiment of a production process of the optical semiconductor element encapsulation resin sheet of the invention.
Figure 2B:

In the above-mentioned step b) or FIG. 2B, it is preferred that an aluminum foil having a thickness of 0.3 to 1 mm is laminated as the metal layer 5 on the adhesive resin layer 4 at 100 to 180° C. and at 0.2 to 0.5 MPa.

Figure 2C:
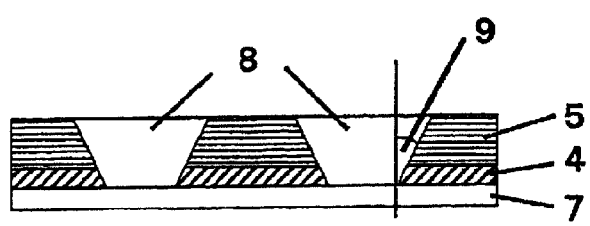

In the above-mentioned step c) or FIG. 2C, the taper-shaped through-hole 8 for forming an encapsulation resin layer may be any, so long as it is a hole passing through the adhesive resin layer 4 and the metal layer 5 adhered onto the adhesive resin layer. In this case, the through-hole having a taper shape is formed so as to expand toward a protective resin layer when the protective resin layer is formed on the encapsulation resin layer, and the angle 9 thereof is preferably from 30 to 50 degrees, and more preferably from 30 to 45 degrees.

The number and size of such through-hole 8 passing through the adhesive resin layer 4 and the metal layer 5 adhered onto the adhesive resin layer may be appropriately selected from the viewpoints of the number and arrangement of LEDs mounted on a substrate. Such a through-hole 8 can be formed, for example, by punching, drilling or the like.

Figure 2D:
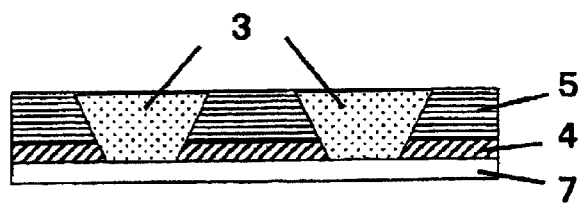

In the above-mentioned step d) or FIG. 2D, the encapsulation resin filled in the through-hole 8 is preferably an uncrosslinked resin, and desirably poured thereinto, for example, with a dispenser or the like, followed by heating preferably at 80 to 120° C., and preferably for 5 to 30 minutes to form the encapsulation resin layer 3 in a semi-cured state.

Figure 2E:
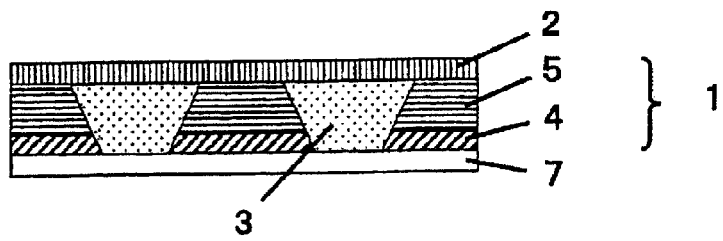

In the above-mentioned step e) or FIG. 2E, the protective resin layer 2 can be laminated on surfaces of both of the metal layer 5 and the encapsulation resin layer 3 formed adjacently to each other, for example, preferably at 100 to 160° C., and preferably taking 10 to 60 seconds.

The optical semiconductor element encapsulation resin sheet obtained above is suitably used, for example, for optical semiconductor devices on which blue or white LED elements are mounted (back lights of liquid crystal screens, traffic signals, large-sized outdoor displays, billboards and the like).

Furthermore, the invention provides an optical semiconductor device containing an optical semiconductor element encapsulated by using the above-mentioned optical semiconductor element encapsulation resin sheet. Such an optical semiconductor device can be efficiently produced, because the above-mentioned resin sheet is used.

Then, a process for producing an optical semiconductor device using the optical semiconductor element encapsulation resin sheet of the invention will be described below. One embodiment of a production process of an optical semiconductor device of the invention may include steps of:

(1) laminating the optical semiconductor element encapsulation resin sheet of the invention on a surface of a substrate on which an optical semiconductor element is mounted, so as to position the encapsulation resin layer to a position facing to the optical semiconductor element, and (2) pressure curing the resin sheet laminated in the step (1).

In the step (1), examples of methods for performing lamination so as to position the encapsulation resin layer to a position facing to the optical semiconductor element include a method of laminating the sheet of the invention on a substrate on which an optical semiconductor element is mounted, by using a laminator, a vacuum press or the like.

In the step (2), as conditions for pressure curing the sheet, the sheet is pressed on the substrate by using the vacuum press preferably at 80 to 150° C., more preferably at 80 to 100° C., and preferably at 0.2 to 0.5 MPa, more preferably at 0.2 to 0.3 MPa, followed by post curing (secondary curing) preferably at 100 to 150° C., more preferably at 100 to 120° C., preferably for 1 to 24 hours, more preferably for 1 to 2 hours.

Further, the step (2) may be carried out at the same time with the step (1).

Although an embodiment of the invention is described in the following example, the invention is not limited thereto.

EXAMPLE

Example 1

A 30-wt % methyl ethyl ketone solution of a transfer molding transparent epoxy resin (NT-8528, manufactured by Nitto Denko Corporation) was applied onto a release-treated PET film as a base material, and dried at 80 to 100° C. for 10 to 15 minutes to form a 50-μm thick epoxy resin layer (adhesive resin layer) in a semi-cured state (FIG. 2A). Next, a 0.6-mm thick aluminum foil as a metal layer was laminated on the above-mentioned epoxy resin layer (adhesive resin layer) at 100° C. and 0.3 MPa (FIG. 2B). Then, a taper-shaped through-hole (the shape of a bottom face (a face on the base material side) was circular, and the size of the bottom face was 3 mm in diameter) that the angle expanding toward a protective resin layer in the shape of encapsulation resin layer became 30 degrees was formed through the metal layer and the adhesive resin layer by punching (FIG. 2C). Further, a transfer molding transparent epoxy resin (NT-8528, manufactured by Nitto Denko Corporation) was poured into the through-hole formed, with a dispenser, and then, heated at 100° C. for 0.5 hour to form an encapsulation resin layer (650 μm in thickness) in a semi-cured state, thereby disposing the encapsulation resin layer and the metal layer adhered onto the adhesive resin layer adjacently to each other (FIG. 2D). Finally, the same epoxy resin layer (100 μm in thickness) as used as the above-mentioned adhesive resin layer was formed on the same PET film as described above, and laminated at 100° C. and at 0.3 MPa to obtain an optical semiconductor element encapsulation resin sheet (750 μm in thickness) in which the protective resin layer was laminated on the encapsulation resin layer and the metal layer so as to cover the both layers, and the encapsulation resin layer had a taper shape expanding toward the protective resin layer (FIG. 2E). The PET film is peeled off at the time of use.

(Production of Optical Semiconductor Device)

The optical semiconductor element encapsulation resin sheet of Example 1 was laminated on a surface of a substrate on which a blue light emitting diode was mounted, positioning the encapsulation resin layer to a position facing to the optical semiconductor element, pressed at 150° C. and at 0.3 MPa, and then, post-cured at 150° C. for 2 hours to obtain an optical semiconductor device containing an optical semiconductor element encapsulated.

The optical semiconductor element encapsulation resin sheet of the invention is capable of simplifying a step of encapsulating an optical semiconductor element and a step of mounting a metal layer on a substrate to thereby efficiently perform encapsulation of an optical semiconductor element. Accordingly, an optical semiconductor device containing an optical semiconductor element encapsulated by using the resin sheet can be efficiently produced.

The optical semiconductor element encapsulation resin sheet of the invention can be suitably used for back lights of liquid crystal screens, traffic signals, large-sized outdoor displays, billboards and the like.

While the present invention has been described in detail and with reference to specific embodiments thereof, it will be apparent to one skilled in the art that various changes and modifications can be made therein without departing from the scope thereof.

This application is based on Japanese patent application No. 2008-078352 filed Mar. 25, 2008, the entire contents thereof being hereby incorporated by reference.

What is claimed is:

1. A resin sheet for encapsulating an optical semiconductor element, the resin sheet comprising an encapsulation resin layer, an adhesive resin layer, a metal layer and a protective resin layer,
   wherein the encapsulation resin layer and the metal layer adhered onto the adhesive resin layer are disposed adjacently to each other,
   wherein the protective resin layer is laminated on the encapsulation resin layer and the metal layer so as to cover both the encapsulation resin layer and the metal layer, and
   wherein the encapsulation resin layer has a taper shape expanding toward the protective resin layer.

2. The resin sheet according to claim 1, wherein an angle expanding toward the protective resin layer in the shape of the encapsulation resin layer is from 30 to 50 degrees.

3. The resin sheet according to claim 1, wherein the metal layer comprises copper or aluminum.

4. An optical semiconductor device comprising an optical semiconductor element encapsulated by using the resin sheet according to claim 1.

* * * * *